(12) United States Patent
Gejo (10) Patent No.: US 12,426,326 B2
(45) Date of Patent: Sep. 23, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Ryohei Gejo, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 346 days.

(21) Appl. No.: 18/164,426

(22) Filed: Feb. 3, 2023

(65) Prior Publication Data

US 2024/0088220 A1 Mar. 14, 2024

(30) Foreign Application Priority Data

Sep. 14, 2022 (JP) .................... 2022-145731

(51) Int. Cl.
*H10D 62/10* (2025.01)
*H10D 12/00* (2025.01)
*H10D 84/60* (2025.01)

(52) U.S. Cl.
CPC ......... *H10D 62/127* (2025.01); *H10D 12/481* (2025.01); *H10D 62/107* (2025.01); *H10D 84/617* (2025.01)

(58) Field of Classification Search
CPC ... H10D 12/481; H10D 62/107; H10D 84/617
USPC ........................................ 257/140
See application file for complete search history.

(56) References Cited

U.S. PATENT DOCUMENTS

| | | | |
|---|---|---|---|
| 7,750,365 B2 | 7/2010 | Takahashi et al. |
| 8,344,415 B2 | 1/2013 | Ruething et al. |
| 10,438,946 B2 | 10/2019 | Oota et al. |
| 10,756,181 B1 | 8/2020 | Kawakami et al. |

(Continued)

FOREIGN PATENT DOCUMENTS

| | | | |
|---|---|---|---|
| JP | 2005-057235 A | 3/2005 |
| JP | 5619758 B2 | 11/2014 |

(Continued)

OTHER PUBLICATIONS

Notice of Reasons for Refusal (Office Action) mailed Jul. 15, 2025 in counterpart Japanese Patent Application No. 2022-145731 with English machine translation, 13 pages.

*Primary Examiner* — Igwe U Anya
(74) *Attorney, Agent, or Firm* — Kim & Stewart LLP (57) ABSTRACT

A semiconductor device of embodiments includes: a semiconductor layer having a first face and a second face; a first semiconductor region of a first conductive type in the semiconductor layer, in contact with the second face, and including a first portion having a first minimum width, a second portion having a second minimum width smaller than the first minimum width, and a third portion connecting the first portion and the second portion and having a third minimum width smaller than the second minimum width; a plurality of second semiconductor regions of a second conductive type in contact with the second face; a third semiconductor region of the second conductive type between the first semiconductor region and the first face; a fourth semiconductor region of the first conductive type; a fifth semiconductor region of the second conductive type; a gate electrode facing the fourth semiconductor region.

11 Claims, 10 Drawing Sheets

(56) References Cited

U.S. PATENT DOCUMENTS

| | | | |
|---|---|---|---|
| 2010/0276727 | A1 | 11/2010 | Storasta et al. |
| 2011/0204414 | A1 | 8/2011 | Kopta et al. |
| 2013/0113087 | A1 | 5/2013 | Ruething et al. |
| 2014/0291724 | A1 | 10/2014 | Voss et al. |
| 2018/0226397 | A1* | 8/2018 | Oota .................... H10D 84/403 |
| 2018/0226399 | A1* | 8/2018 | Tamaki ................ H10D 62/393 |
| 2018/0226487 | A1* | 8/2018 | Oota .................... H10D 12/461 |
| 2019/0296132 | A1* | 9/2019 | Tamaki ................ H10D 84/617 |
| 2021/0398811 | A1 | 12/2021 | Kamimura et al. |

FOREIGN PATENT DOCUMENTS

| | | |
|---|---|---|
| JP | 6697891 B2 | 4/2015 |
| JP | 2018129513 A | 8/2018 |
| JP | 2020-150159 A | 9/2020 |
| JP | 6884114 B2 | 6/2021 |
| JP | 2022000882 A | 1/2022 |

\* cited by examiner

FIG.6
BB' CROSS SECTION

SEMICONDUCTOR DEVICE

CROSS-REFERENCE TO RELATED APPLICATION

This application is based upon and claims the benefit of priority from Japanese Patent Application No. 2022-145731, filed on Sep. 14, 2022, the entire contents of which are incorporated herein by reference.

FIELD

Embodiments described herein relate generally to a semiconductor device.

BACKGROUND

An example of a semiconductor device is an insulated gate bipolar transistor (IGBT). In the IGBT, for example, a p-type collector region, an n-type drift region, and a p-type base region are provided on a collector electrode. Then, in a trench that penetrates the p-type base region and reaches the n-type drift region, a gate electrode is provided with a gate insulating film interposed therebetween. In addition, an n-type emitter region connected to an emitter electrode is provided in a region adjacent to the trench on the surface of the p-type base region.

In recent years, a reverse-conducting IGBT (RC-IGBT) in which an IGBT and a freewheeling diode are formed in the same semiconductor chip has been widely developed and commercialized. The RC-IGBT is used, for example, as a switching element in an inverter circuit. The freewheeling diode has a function of making a current flow in a direction opposite to the on-current of the IGBT. Forming the IGBT and the freewheeling diode in the same semiconductor chip has many advantages, such as a reduction in chip size due to sharing the termination region and dispersion of heat generation locations.

In the RC-IGBT, the provision of the diode may degrade the operating characteristics of the IGBT.

DETAILED DESCRIPTION

A semiconductor device of embodiments includes: a semiconductor layer having a first face and a second face facing the first face; a first semiconductor region of a first conductive type provided in the semiconductor layer, in contact with the second face, and including a first portion having a first minimum width, a second portion having a second minimum width smaller than the first minimum width, and a third portion connecting the first portion and the second portion to each other and having a third minimum width smaller than the second minimum width; a plurality of second semiconductor regions of a second conductive type provided in the semiconductor layer, in contact with the second face, and provided so as to be separated from each other in the first semiconductor region other than the first portion, the second portion, and the third portion; a third semiconductor region of the second conductive type provided in the semiconductor layer and provided between the first semiconductor region and the first face and between the second semiconductor region and the first face; a fourth semiconductor region of the first conductive type provided in the semiconductor layer and provided between the third semiconductor region and the first face; a fifth semiconductor region of the second conductive type provided in the semiconductor layer and provided between the fourth semiconductor region and the first face; a gate electrode facing the fourth semiconductor region; a gate insulating film provided between the fourth semiconductor region and the gate electrode; a first electrode in contact with the first face; and a second electrode in contact with the second face.

Hereinafter, embodiments will be described with reference to the diagrams. In the following description, the same or similar members and the like will be denoted by the same reference numerals, and the description of the members and the like once described will be omitted as appropriate.

In this specification, when there are notations of $n^+$-type, n-type, and $n^-$-type, this means that the n-type impurity concentration decreases in the order of $n^+$-type, n-type, and $n^-$-type. In addition, when there are notations of $p^+$-type, p-type, and $p^-$-type, this means that the p-type impurity concentration decreases in the order of $p^+$-type, p-type, and $p^-$-type.

In this specification, the n-type impurity concentration does not indicate the actual n-type impurity concentration, but indicates the effective n-type impurity concentration after compensation. Similarly, the p-type impurity concentration does not indicate the actual p-type impurity concentration, but indicates the effective p-type impurity concentration after compensation. For example, if the actual n-type impurity concentration is higher than the actual p-type impurity concentration, the n-type impurity concentration is obtained by subtracting the p-type impurity concentration from the actual n-type impurity concentration. The same applies to the p-type impurity concentration.

In this specification, the distribution and absolute value of the impurity concentration in a semiconductor region can be measured by using, for example, secondary ion mass spectrometry (SIMS). In addition, the relative magnitude relationship between the impurity concentrations in two semiconductor regions can be determined by using, for example, scanning capacitance microscopy (SCM). In addition, the distribution and absolute value of the impurity concentration can be measured by using, for example, spreading resistance analysis (SRA). By the SCM and the SRA, the relative magnitude relationship or absolute values of the carrier concentrations in semiconductor regions can be calculated. By assuming the activation rate of impurities, the relative magnitude relationship between the impurity concentrations in two semiconductor regions, the distribution of the impurity concentration, and the absolute value of the impurity concentration can be calculated from the measurement results of the SCM and the SRA.

First Embodiment

A semiconductor device according to a first embodiment includes: a semiconductor layer having a first face and a second face facing the first face; a first semiconductor region of a first conductive type provided in the semiconductor layer, in contact with the second face, and including a first portion having a first minimum width, a second portion having a second minimum width smaller than the first minimum width, and a third portion connecting the first portion and the second portion to each other and having a third minimum width smaller than the second minimum width; a plurality of second semiconductor regions of a second conductive type provided in the semiconductor layer, in contact with the second face, and provided so as to be separated from each other in the first semiconductor region other than the first portion, the second portion, and the third portion; a third semiconductor region of the second conductive type provided in the semiconductor layer and provided between the first semiconductor region and the first face and between the second semiconductor region and the first face; a fourth semiconductor region of the first conductive type provided in the semiconductor layer and provided between the third semiconductor region and the first face; a fifth semiconductor region of the second conductive type provided in the semiconductor layer and provided between the fourth semiconductor region and the first face; a gate electrode facing the fourth semiconductor region; a gate insulating film provided between the fourth semiconductor region and the gate electrode; a first electrode in contact with the first face; and a second electrode in contact with the second face.

The semiconductor device according to the first embodiment is an RC-IGBT 100 in which an IGBT and a freewheeling diode are formed in the same semiconductor chip. The RC-IGBT 100 has a trench gate type IGBT including a gate electrode in a trench formed in a semiconductor layer. Hereinafter, a case where the first conductive type is p-type and the second conductive type is n-type will be described as an example.

Figure 1:
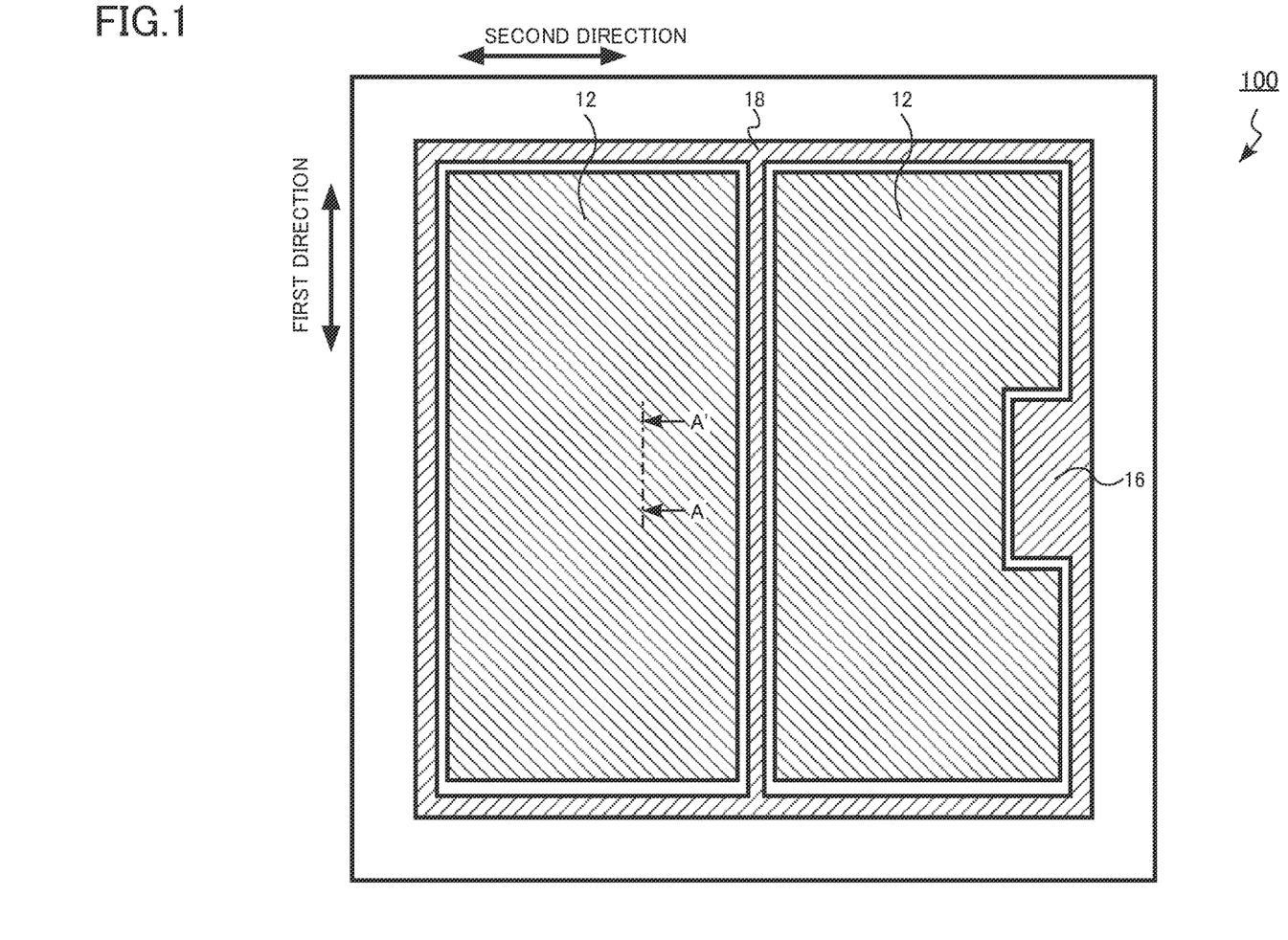
FIG. 1 is a schematic plan view of a semiconductor device according to a first embodiment.

FIG. 1 is a schematic plan view of the semiconductor device according to the first embodiment. FIG. 1 shows an electrode and wiring pattern on the first face side of the RC-IGBT 100.

Figure 2:
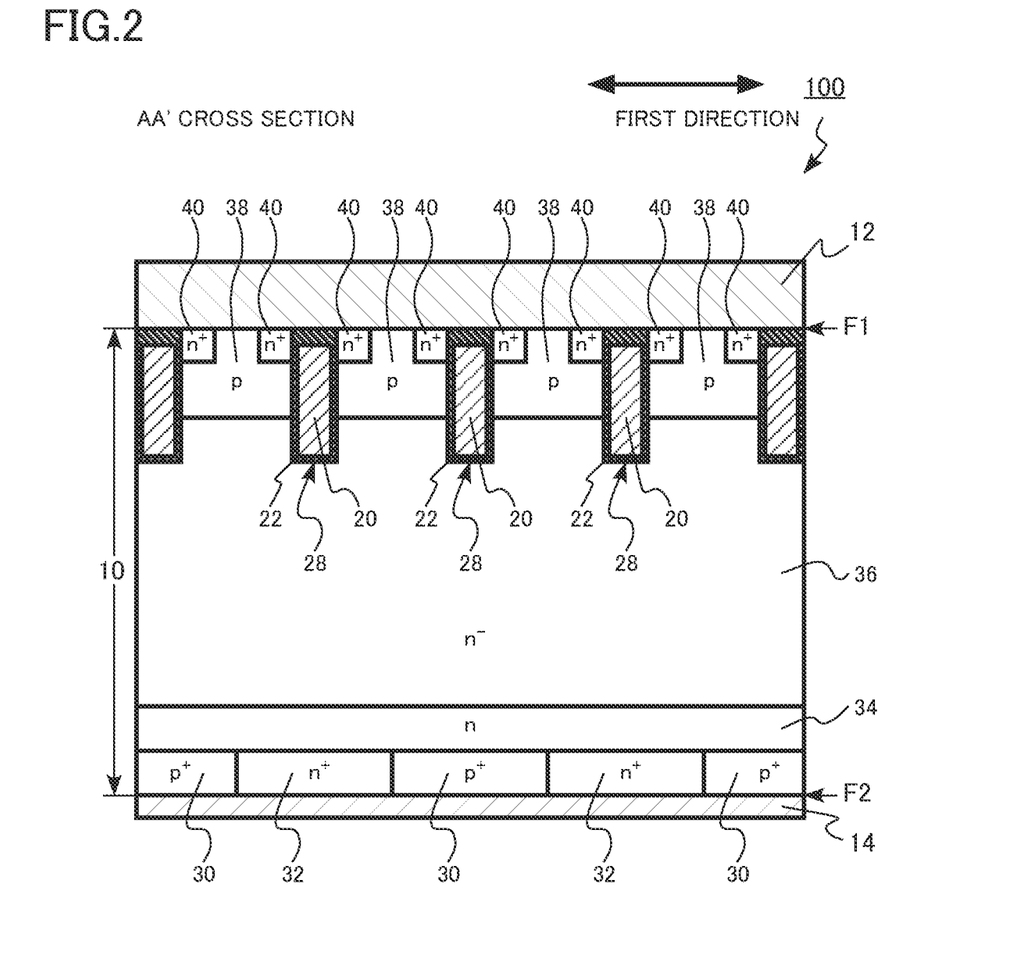
FIG. 2 is a schematic cross-sectional view of a part of the semiconductor device according to the first embodiment.

FIG. 2 is a schematic cross-sectional view of a part of the semiconductor device according to the first embodiment. FIG. 2 is a cross-sectional view taken along the line AA' of FIG. 1.

Figure 3:
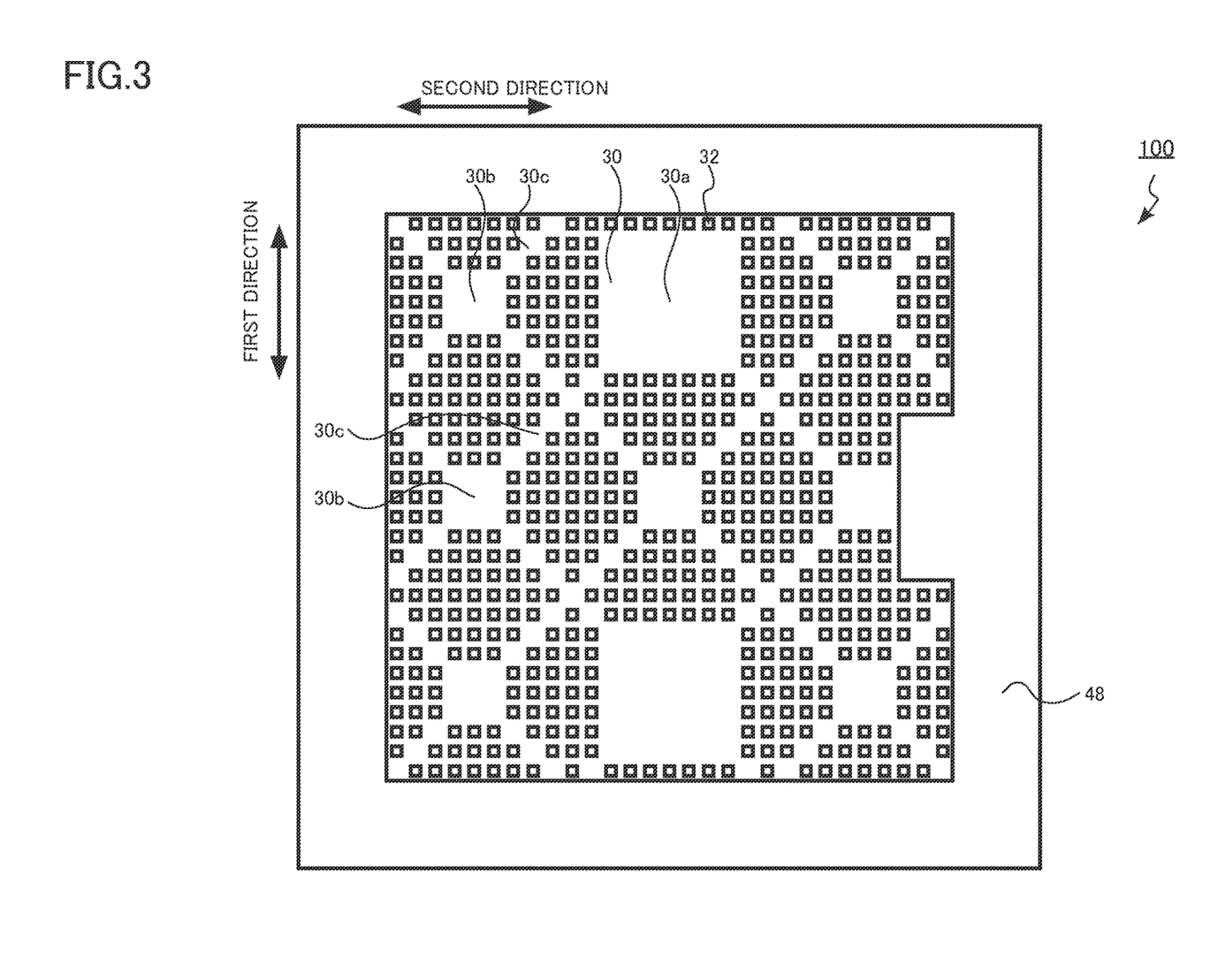
FIG. 3 is a schematic plan view of the semiconductor device according to the first embodiment.

FIG. 3 is a schematic plan view of the semiconductor device according to the first embodiment. FIG. 3 shows a pattern of semiconductor regions in a semiconductor layer on the second face side of the RC-IGBT 100.

Figure 4:
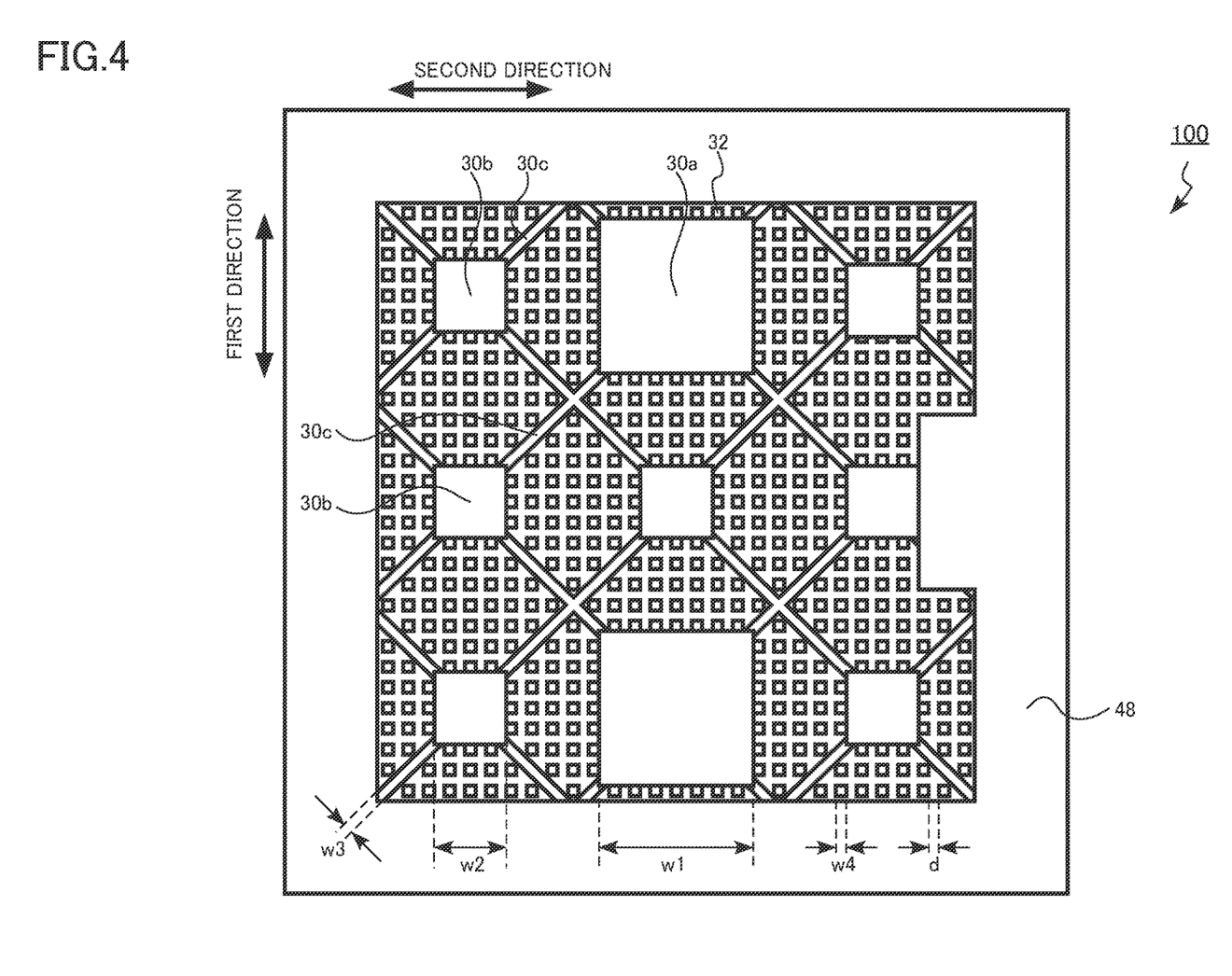
FIG. 4 is a schematic plan view of the semiconductor device according to the first embodiment.

FIG. 4 is a schematic plan view of the semiconductor device according to the first embodiment. FIG. 4 is an explanatory diagram of the pattern of semiconductor regions in a semiconductor layer on the second face side of the RC-IGBT 100. FIG. 4 is a diagram corresponding to FIG. 3.

Figure 5:
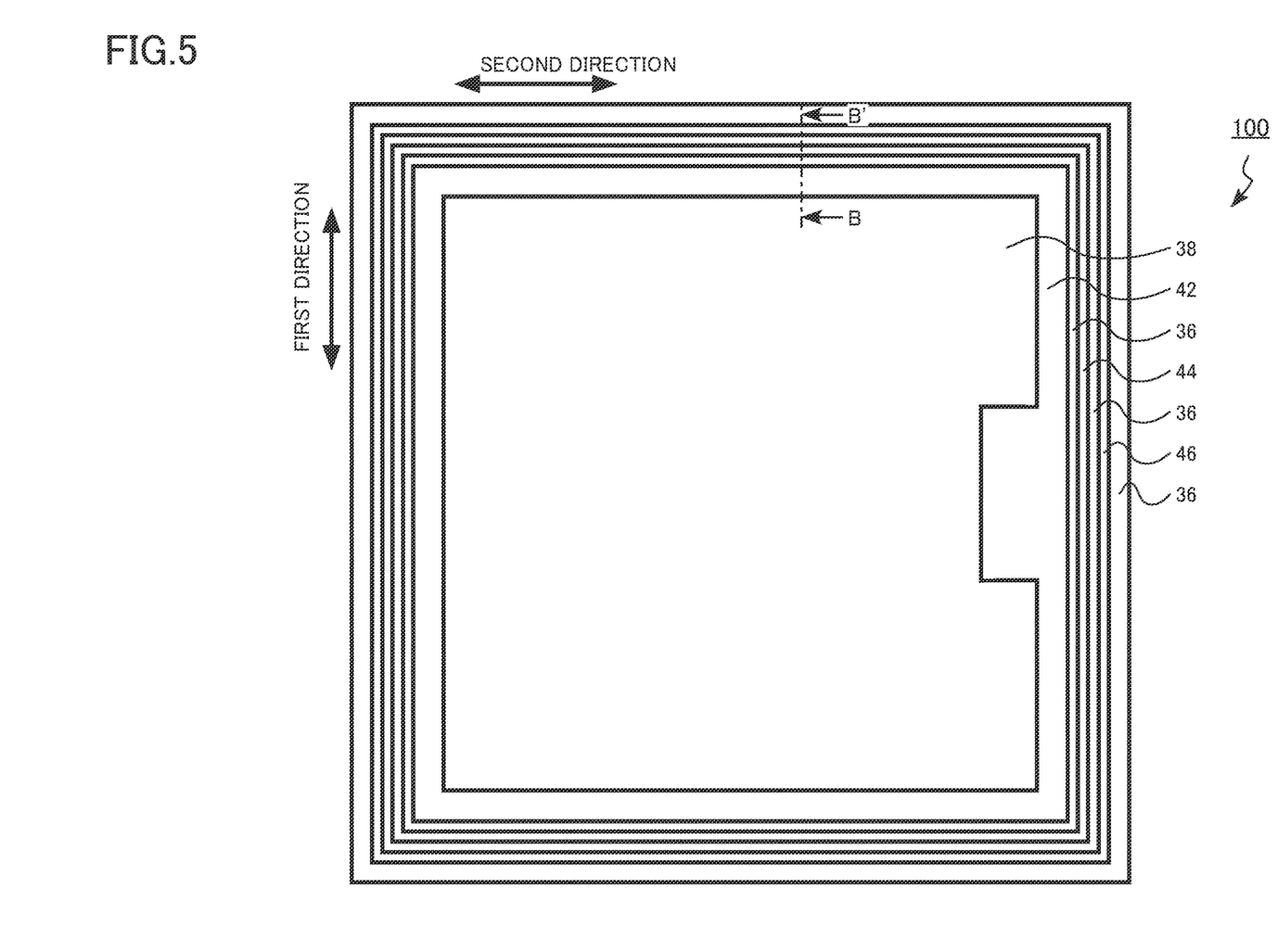
FIG. 5 is a schematic plan view of the semiconductor device according to the first embodiment.

FIG. 5 is a schematic plan view of the semiconductor device according to the first embodiment. FIG. 5 shows the pattern of semiconductor regions in a semiconductor layer on the first face side of the RC-IGBT 100.

Figure 6:
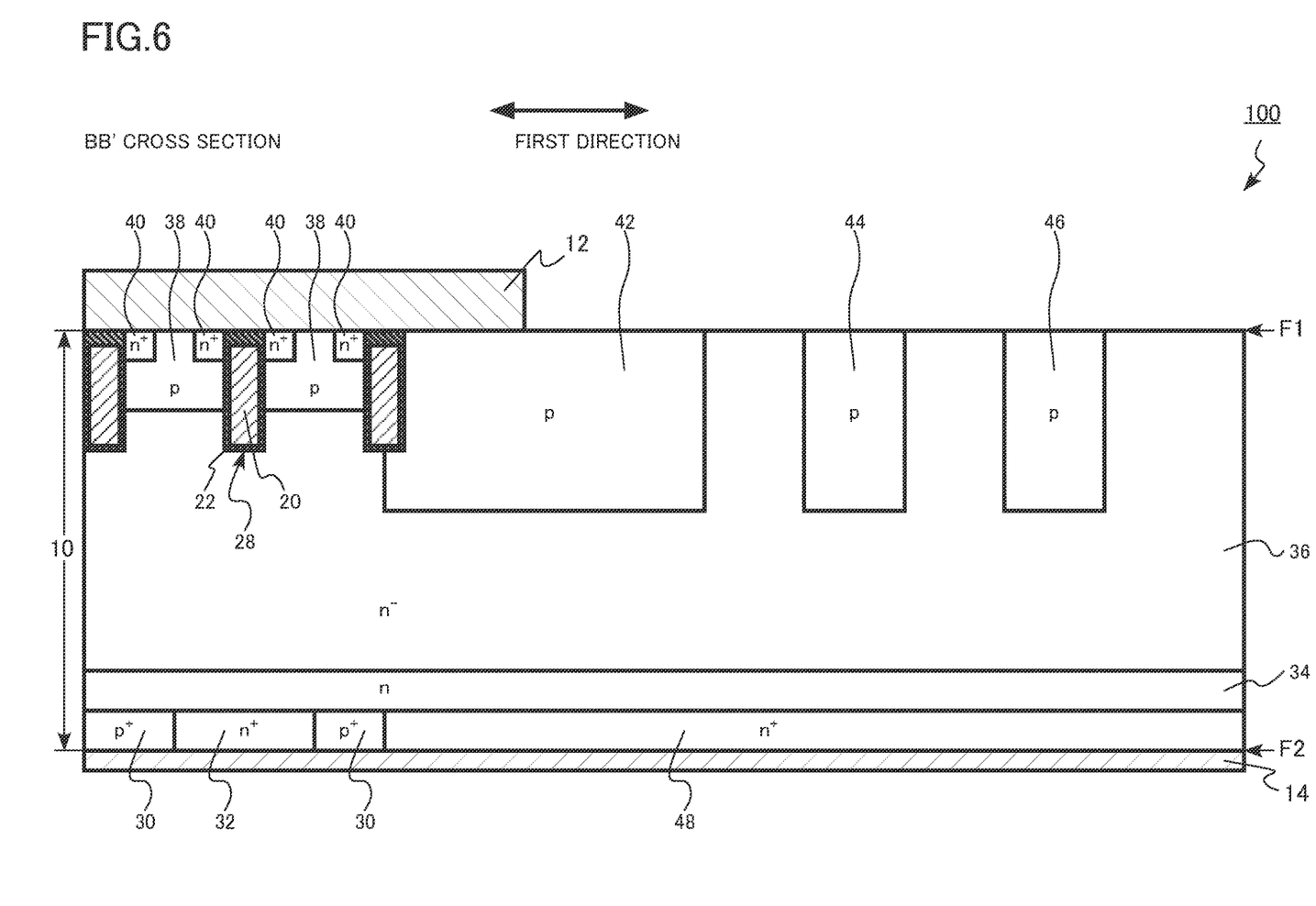
FIG. 6 is a schematic cross-sectional view of a part of the semiconductor device according to the first embodiment.

FIG. 6 is a schematic cross-sectional view of a part of the semiconductor device according to the first embodiment. FIG. 6 is a cross-sectional view taken along the line BB' of FIG. 5.

The RC-IGBT 100 according to the first embodiment includes a semiconductor layer 10, an upper electrode 12 (first electrode), a lower electrode 14 (second electrode), a gate electrode pad 16, a gate wiring 18, a gate electrode 20, and a gate insulating film 22.

In the semiconductor layer 10, a trench 28, a $p^+$-type collector region 30 (first semiconductor region), an $n^+$-type cathode region 32 (second semiconductor region), an n-type buffer region 34, an $n^-$-type drift region 36 (third semiconductor region), a p-type base region 38 (fourth semiconductor region), an $n^+$-type emitter region 40 (fifth semiconductor region), a p-type first guard ring region 42 (sixth semiconductor region), a p-type second guard ring region 44 (eighth semiconductor region), a p-type third guard ring region 46, and an $n^+$-type peripheral cathode region 48 (seventh semiconductor region) are provided.

The $p^+$-type collector region 30 includes a first portion 30a, a second portion 30b, and a third portion 30c.

The semiconductor layer 10 has a first face F1 and a second face F2 facing the first face F1. The semiconductor layer 10 is, for example, single crystal silicon. The thickness of the semiconductor layer 10 is, for example, equal to or more than 40 μm and equal to or less than 700 μm.

In this specification, one direction parallel to the first face F1 is referred to as a first direction. In addition, a direction parallel to the first face F1 and perpendicular to the first direction is referred to as a second direction. In addition, in this specification, the "depth" is defined as a distance in a direction toward the second face F2 with the first face F1 as a reference.

The upper electrode 12 is provided on the first face F1 side of the semiconductor layer 10. The upper electrode 12 is an example of the first electrode. At least a part of the upper electrode 12 is in contact with the first face F1 of the semiconductor layer 10.

The upper electrode 12 functions as an emitter electrode of a transistor when the RC-IGBT 100 operates as a transistor. In addition, the upper electrode 12 functions as an anode electrode of the diode when the RC-IGBT 100 operates as a diode.

The upper electrode 12 is in contact with the base region 38. The upper electrode 12 is in contact with the emitter region 40. The upper electrode 12 is in contact with the first guard ring region 42. The upper electrode 12 is electrically connected to the base region 38, the emitter region 40, and the first guard ring region 42.

The upper electrode 12 is, for example, a metal.

The lower electrode 14 is provided on the second face F2 side of the semiconductor layer 10. The lower electrode 14 is an example of the second electrode. At least a part of the lower electrode 14 is in contact with the second face F2 of the semiconductor layer 10.

The lower electrode 14 functions as a collector electrode of the transistor when the RC-IGBT 100 operates as a transistor. In addition, the lower electrode 14 functions as a cathode electrode of the diode when the RC-IGBT 100 operates as a diode.

The lower electrode 14 is in contact with the collector region 30. The lower electrode 14 is in contact with the cathode region 32. The lower electrode 14 is in contact with the peripheral cathode region 48. The lower electrode 14 is electrically connected to the collector region 30, the cathode region 32, and the peripheral cathode region 48.

The lower electrode 14 is, for example, a metal.

The gate electrode pad 16 is provided on the first face F1 side of the semiconductor layer 10. The gate electrode pad 16 is, for example, a metal.

The gate wiring 18 is provided on the first face F1 side of the semiconductor layer 10. The gate wiring 18 is connected to the gate electrode pad 16. The gate wiring 18 is electrically connected to the gate electrode 20. The gate electrode pad 16 is, for example, a metal.

The collector region 30 is a $p^+$-type semiconductor region. The collector region 30 is an example of the first semiconductor region.

The collector region 30 is in contact with the second face F2. The collector region 30 is in contact with the lower electrode 14. The collector region 30 is electrically connected to the lower electrode 14. The collector region 30 serves as a hole supply source when the RC-IGBT 100 operates as a transistor.

As shown in FIGS. 3 and 4, the collector region 30 includes the first portion 30a, the second portion 30b, and the third portion 30c. In FIG. 4, solid auxiliary lines are used to clarify the boundaries of the first portion 30a, the second portion 30b, and the third portion 30c.

The first portion 30a is in contact with the second face F2. For example, a plurality of first portions 30a are provided. The first portion 30a has, for example, a square shape. The first portion 30a has a first minimum width (w1 in FIG. 4) on the second face F2.

The second portion 30b is in contact with the second face F2. For example, a plurality of second portions 30b are provided. The second portion 30b has, for example, a square shape. The second portion 30b has a second minimum width (w2 in FIG. 4) on the second face F2.

The third portion 30c is in contact with the second face F2. The third portion 30c connects the first portion 30a and the second portion 30b to each other. The third portion 30c connects, for example, two second portions 30b to each other. For example, all the first portions 30a and all the second portions 30b are connected to each other by the third portions 30c.

The third portion 30c has, for example, a line shape. The third portion 30c is, for example, oblique in the first direction and the second direction, as shown in FIGS. 3 and 4. For example, as shown in FIGS. 3 and 4, a plurality of third portions 30c oblique to each other cross each other to form a lattice shape. The third portion 30c has a third minimum width (w3 in FIG. 4) on the second face F2.

In addition, the minimum width of a figure having a predetermined shape is defined as the diameter of the maximum inscribed circle of the figure. If the shape of the figure is a square, the minimum width is the same as the length of one side of the square. In addition, if the shape of the figure is a rectangle, the minimum width is the same as the length of the short side of the rectangle.

The second minimum width w2 is smaller than the first minimum width w1. The second minimum width w2 is, for example, equal to or more than 50% and equal to or less than 80% of the first minimum width w1.

The third minimum width w3 is smaller than the second minimum width w2. The third minimum width w3 is, for example, equal to or more than 20% and equal to or less than 60% of the second minimum width w2.

The area of the first portion 30a is, for example, larger than the area of the second portion 30b.

The first portion 30a, the second portion 30b, and the third portion 30c of the collector region 30 have a function of suppressing the occurrence of snapback in current-voltage characteristics when the RC-IGBT 100 operates as a transistor.

A plurality of cathode regions 32 are $n^+$-type semiconductor regions. The cathode region 32 is an example of the second semiconductor region.

The cathode region 32 is in contact with the second face F2. The cathode region 32 is in contact with the lower electrode 14. The cathode region 32 is electrically connected to the lower electrode 14. The cathode region 32 serves as an electron supply source when the RC-IGBT 100 operates as a diode.

As shown in FIGS. 3 and 4, on the second face, the cathode regions 32 are provided so as to be separated from each other in the collector region 30. On the second face, the cathode region 32 is provided in the collector region other than the first portion 30a, the second portion 30b, and the third portion 30c.

The cathode region 32 has, for example, a square shape. On the second face F2, the cathode region 32 has a fourth minimum width (w4 in FIG. 4). For example, as shown in FIGS. 3 and 4, a plurality of cathode regions 32 are arranged in dots.

The third minimum width w3 of the third portion 30c is, for example, larger than a distance (d in FIG. 4) between the two cathode regions 32 at the closest positions among the plurality of cathode regions 32. The third minimum width w3 is, for example, equal to or more than 1.2 times the distance d between the two cathode regions 32 at the closest positions among the plurality of cathode regions 32.

For example, the fourth minimum width w4 of the cathode region 32 is smaller than the third minimum width w3 of the third portion 30c. For example, the fourth minimum width w4 of the cathode region 32 is equal to or less than 80% of the third minimum width w3 of the third portion 30c.

The buffer region 34 is an n-type semiconductor region. The buffer region 34 is provided between the collector region 30 and the first face F1. The buffer region 34 is provided between the cathode region 32 and the first face F1.

The buffer region 34 has a function of suppressing the extension of a depletion layer extending to the drift region 36, for example, when the RC-IGBT 100 is turned off.

The n-type impurity concentration in the buffer region 34 is lower than the n-type impurity concentration in the cathode region 32.

The drift region 36 is an $n^-$-type semiconductor region. The drift region 36 is an example of the third semiconductor region. The drift region 36 is provided between the buffer region 34 and the first face F1.

The drift region 36 serves as an on-current path when the RC-IGBT 100 operates as a transistor and when the RC-IGBT 100 operates as a diode. In addition, the drift region 36 has a function of maintaining the breakdown voltage of the RC-IGBT 100 by being depleted when the RC-IGBT 100 is turned off.

The n-type impurity concentration in the drift region 36 is lower than the n-type impurity concentration in the buffer region 34.

The base region 38 is a p-type semiconductor region. The base region 38 is an example of the fourth semiconductor region. The base region 38 is provided between the drift region 36 and the first face F1.

The base region 38 is in contact with the upper electrode 12. The base region 38 is electrically connected to the upper electrode 12.

A region of the base region 38 facing the gate electrode 20 forms an n-type inversion layer when the RC-IGBT 100 operates as a transistor. The base region 38 functions as a channel region of the transistor. In addition, the base region 38 functions as a hole supply source when the RC-IGBT 100 operates as a diode.

The emitter region 40 is an $n^+$-type semiconductor region. The emitter region 40 is an example of the fifth semiconductor region. The emitter region 40 is provided between the base region 38 and the first face F1.

The emitter region 40 is in contact with the gate insulating film 22.

The emitter region 40 is in contact with the upper electrode 12. The emitter region 40 is electrically connected to the upper electrode 12. The emitter region 40 serves as an electron supply source when the RC-IGBT 100 operates as a transistor.

The first guard ring region 42 is a p-type semiconductor region. The first guard ring region 42 is an example of the sixth semiconductor region. The first guard ring region 42 is provided between the drift region 36 and the first face F1.

As shown in FIG. 5, the first guard ring region 42 surrounds the base region 38 on the first face F1. The first guard ring region 42 is in contact with the base region 38. In addition, the emitter region 40 is not shown in FIG. 5.

The first guard ring region 42 is in contact with the upper electrode 12. The first guard ring region 42 is electrically connected to the upper electrode 12.

The p-type impurity concentration in the first guard ring region 42 is higher than the p-type impurity concentration in the base region 38. The p-type impurity concentration in the first guard ring region 42 is, for example, equal to or more than twice the p-type impurity concentration in the base region 38.

The depth of the first guard ring region 42 with respect to the first face F1 is, for example, larger than the depth of the base region 38 with respect to the first face F1. The depth of the first guard ring region 42 with respect to the first face F1 is, for example, equal to or more than 1.2 times the depth of the base region 38 with respect to the first face F1.

The first guard ring region 42 has a function of improving the breakdown voltage of the RC-IGBT 100. In addition, the first guard ring region 42 functions as a hole supply source when the RC-IGBT 100 operates as a diode.

The second guard ring region 44 is a p-type semiconductor region. The second guard ring region 44 is an example of the eighth semiconductor region. The second guard ring region 44 is provided between the drift region 36 and the first face F1.

As shown in FIG. 5, the second guard ring region 44 surrounds the first guard ring region 42 on the first face F1. On the first face F1, the drift region 36 is provided between the second guard ring region 44 and the first guard ring region 42.

The second guard ring region 44 is separated from the upper electrode 12. The second guard ring region 44 is electrically isolated from the upper electrode 12.

The p-type impurity concentration in the second guard ring region 44 is higher than the p-type impurity concentration in the base region 38. The p-type impurity concentration in the second guard ring region 44 is, for example, equal to or more than twice the p-type impurity concentration in the base region 38.

The depth of the second guard ring region 44 with respect to the first face F1 is, for example, larger than the depth of the base region 38 with respect to the first face F1. The depth of the second guard ring region 44 with respect to the first face F1 is, for example, equal to or more than 1.2 times the depth of the base region 38 with respect to the first face F1.

The second guard ring region 44 has a function of improving the breakdown voltage of the RC-IGBT 100.

The third guard ring region 46 is a p-type semiconductor region. The third guard ring region 46 is provided between the drift region 36 and the first face F1.

As shown in FIG. 5, the third guard ring region 46 surrounds the second guard ring region 44 on the first face F1. On the first face F1, the drift region 36 is provided between the third guard ring region 46 and the second guard ring region 44.

The third guard ring region 46 is separated from the upper electrode 12. The third guard ring region 46 is electrically isolated from the upper electrode 12.

The p-type impurity concentration in the third guard ring region 46 is higher than the p-type impurity concentration in the base region 38. The p-type impurity concentration in the third guard ring region 46 is, for example, equal to or more than twice the p-type impurity concentration in the base region 38.

The depth of the third guard ring region 46 with respect to the first face F1 is, for example, larger than the depth of the base region 38 with respect to the first face F1. The depth of the third guard ring region 46 with respect to the first face F1 is, for example, equal to or more than 1.2 times the depth of the base region 38 with respect to the first face F1.

The third guard ring region 46 has a function of improving the breakdown voltage of the RC-IGBT 100.

The peripheral cathode region 48 is an $n^+$-type semiconductor region. The peripheral cathode region 48 is an example of the seventh semiconductor region.

As shown in FIG. 3, the peripheral cathode region 48 surrounds the collector region 30 on the second face F2. The peripheral cathode region 48 is in contact with the collector region 30.

As shown in FIG. 6, the peripheral cathode region 48 is provided in a direction from the first face F1 toward the second face F2 with respect to the first guard ring region 42. In addition, the peripheral cathode region 48 is provided in a direction from the first face F1 toward the second face F2 with respect to the second guard ring region 44, for example. In addition, the peripheral cathode region 48 is provided in a direction from the first face F1 toward the second face F2 with respect to the third guard ring region 46, for example.

In other words, the peripheral cathode region 48 is provided immediately below the first guard ring region 42, the second guard ring region 44, and the third guard ring region 46, for example.

The peripheral cathode region 48 is in contact with the second face F2. The peripheral cathode region 48 is in contact with the lower electrode 14. The peripheral cathode region 48 is electrically connected to the lower electrode 14.

The n-type impurity concentration in the peripheral cathode region 48 is, for example, equal to the n-type impurity concentration in the cathode region 32.

The width of the peripheral cathode region 48 in the first direction is, for example, larger than the width of the first guard ring region in the first direction. In addition, the width of the peripheral cathode region 48 in the second direction is, for example, larger than the width of the first guard ring region in the second direction.

The peripheral cathode region 48 serves as an electron supply source when the RC-IGBT 100 operates as a diode.

Next, the operation of the RC-IGBT 100 will be described.

When the RC-IGBT 100 operates as a transistor, a positive voltage is applied to the lower electrode 14 with respect to the upper electrode 12. Then, a voltage exceeding a threshold voltage is applied to the gate electrode 20. When a voltage exceeding the threshold voltage is applied to the gate electrode 20, an n-type inversion layer is formed in a region of the base region 38 facing the gate electrode 20. In other words, a channel is formed in the region of the base region 38 facing the gate electrode 20.

When an n-type inversion layer is formed in the region of the base region 38 facing the gate electrode 20, electrons are injected from the upper electrode 12 into the drift region 36 through the emitter region 40 and the channel. In addition, holes are injected from the lower electrode 14 into the drift region 36 through the collector region 30.

An on-current flows from the lower electrode 14 to the upper electrode 12, so that the transistor of the RC-IGBT 100 is turned on. Then, when a voltage lower than the threshold voltage is applied to the gate electrode 20, the channel disappears and accordingly, the transistor of the RC-IGBT 100 is turned off.

When the RC-IGBT 100 operates as a diode, a positive voltage is applied to the upper electrode 12 with respect to the lower electrode 14. A voltage lower than a threshold voltage is applied to the gate electrode 20.

Holes are injected from the upper electrode 12 into the drift region 36 through the base region 38. In addition, electrons are injected from the lower electrode 14 into the drift region 36 through the cathode region 32.

An on-current flows from the upper electrode 12 to the lower electrode 14, so that the diode of the RC-IGBT 100 is turned on. Then, when the voltage of the lower electrode 14 becomes equal to or more than the voltage of the upper electrode 12, the diode of the RC-IGBT 100 is turned off.

Next, the function and effect of the semiconductor device according to the first embodiment will be described.

Figure 7:
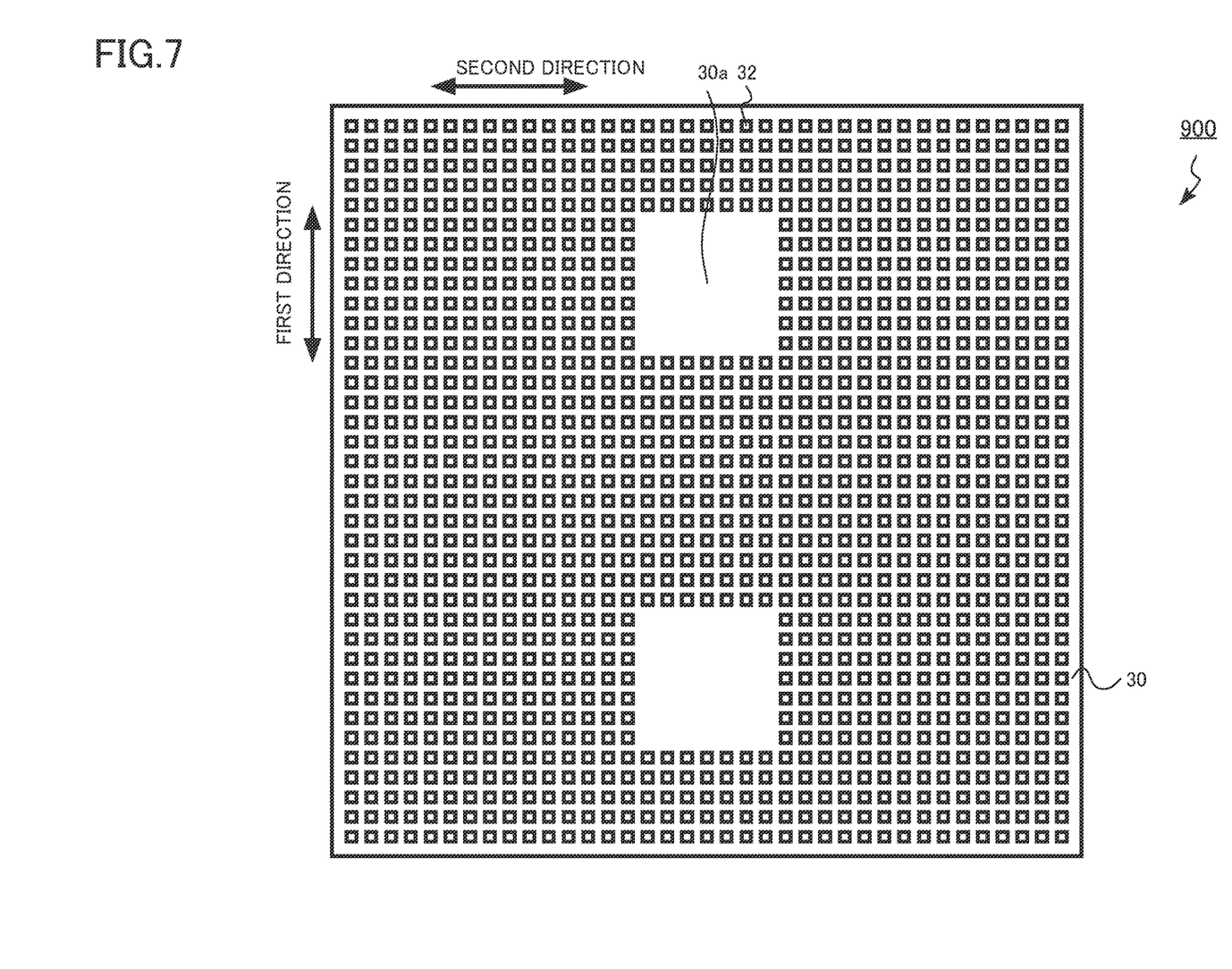
FIG. 7 is a schematic plan view of a semiconductor device of a comparative example.

FIG. 7 is a schematic plan view of a semiconductor device of a comparative example. FIG. 7 shows a pattern of semiconductor regions in a semiconductor layer on the second face side of an RC-IGBT 900 of the comparative example. FIG. 7 is a diagram corresponding to FIG. 3 of the first embodiment.

The RC-IGBT 900 of the comparative example is different from the RC-IGBT 100 according to the first embodiment in that the $p^+$-type collector region 30 does not include the second portion 30b and the third portion 30c. In addition, the RC-IGBT 900 of the comparative example is different from the RC-IGBT 100 according to the first embodiment in that the $n^+$-type peripheral cathode region 48 is not included.

Figure 8:
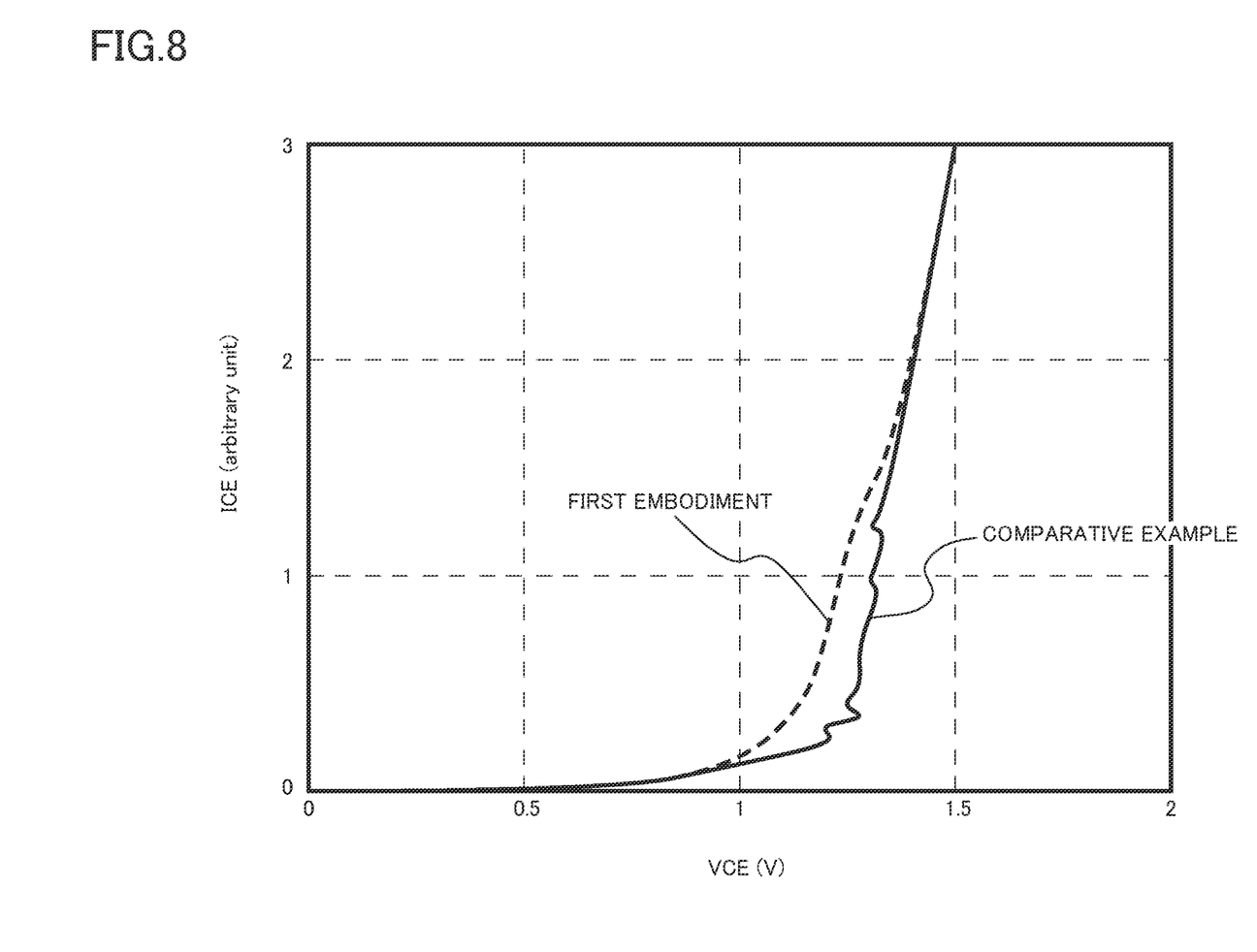
FIG. 8 is an explanatory diagram of the function and effect of the semiconductor device according to the first embodiment.

FIG. 8 is an explanatory diagram of the function and effect of the semiconductor device according to the first embodiment. FIG. 8 is a diagram showing current-voltage characteristics when the RC-IGBT 900 of the comparative example and the RC-IGBT 100 operate as transistors.

FIG. 8 shows the current-voltage characteristics when a positive voltage is applied to the lower electrode 14 (collector electrode) with respect to the upper electrode 12 (emitter electrode) while a voltage exceeding the threshold voltage is applied to the gate electrode 20. Hereinafter, the voltage applied to the lower electrode 14 (collector electrode) will be referred to as a collector voltage (VCE), and the current flowing from the lower electrode 14 (collector electrode) to the upper electrode 12 (emitter electrode) will be referred to as a collector current (ICE).

As shown in FIG. 8, in the RC-IGBT 900 of the comparative example, snapback noticeably occurs in the current-voltage characteristics.

For example, a case is considered in which a plurality of RC-IGBTs 900 connected in parallel to each other are used. When snapback occurs in the current-voltage characteristics of the RC-IGBTs 900, the currents flowing through the plurality of RC-IGBTs 900 connected in parallel to each other become unbalanced. For example, an excessive current may flow through one RC-IGBT 900 to destroy the RC-IGBT 900. Therefore, it is desirable to suppress the occurrence of snapback in the current-voltage characteristics of the RC-IGBTs.

The reason why snapback occurs in the current-voltage characteristics of the RC-IGBT 900 of the comparative example is considered to be that the amount of holes injected from the collector region 30 to the drift region 36 changes discontinuously as the voltage increases.

Hole injection from the collector region 30 into the buffer region 34 and the drift region 36 occurs from a wide portion of the collector region 30. At a junction surface between the collector region 30 and the buffer region 34 far from the $n^+$-type cathode region 32, the effect of potential wrap-around due to the current flowing from the cathode region 32 is reduced due to the distance from the cathode region 32.

For this reason, the voltage difference between the collector region 30 and the buffer region 34 tends to increase. Therefore, in the wide portion of the collector region 30, hole injection tends to occur at a low collector voltage.

In the RC-IGBT 900 of the comparative example, since the wide first portion 30a is provided, the injection of holes from the collector region 30 to the drift region 36 tends to occur in a low voltage region where the collector voltage is less than 1 V. Therefore, in the RC-IGBT 900 of the comparative example, the occurrence of snapback in a low voltage region where the collector voltage is less than 1 V is suppressed.

On the other hand, as shown in FIG. 8, in the RC-IGBT 900 of the comparative example, the occurrence of snapback in a region where the collector voltage is equal to or more than 1 V is noticeable. It is thought that this is because the voltage difference between the collector region 30 and the buffer region 34 is unlikely to increase in the collector region 30 away from the first portion 30a and accordingly, hole injection from the collector region 30 to the drift region 36 is suppressed.

As shown in FIG. 8, in the RC-IGBT 100 according to the first embodiment, the occurrence of snapback in a region where the collector voltage is equal to or more than 1 V is suppressed. This is considered to be due to the following reasons.

First, in the RC-IGBT 100 according to the first embodiment, the wide second portion 30b is provided in addition to the first portion 30a. By providing the second portion 30b, hole injection in the second portion 30b is likely to occur. Therefore, the continuity of the amount of holes injected from the collector region 30 to the drift region 36 with respect to the voltage increase is improved. As a result, the occurrence of snapback in a region where the collector voltage is equal to or more than 1 V is suppressed.

In addition, in the RC-IGBT 100 according to the first embodiment, the third portion 30c that connects the first portion 30a and the second portion 30b to each other is provided. In a low voltage region where the collector voltage is less than 1 V, hole injection occurs in the first portion 30a as described above. Then, the hole injection that has occurred in the first portion 30a propagates through the third portion 30c, which makes the hole injection in the second portion 30b more likely to occur. Therefore, the continuity of the amount of holes injected from the collector region 30 to the drift region 36 with respect to the voltage increase is further improved. As a result, the occurrence of snapback in a region where the collector voltage is equal to or more than 1 V is further suppressed.

The third minimum width w3 of the third portion 30c is preferably larger than the distance d between the two closest cathode regions 32 among the plurality of $n^+$-type cathode regions 32. By satisfying the above conditions, hole injection that has occurred in the first portion 30a is easily propagated in the third portion 30c, which promotes hole injection in the second portion 30b. Therefore, the occurrence of snapback is further suppressed.

The third minimum width w3 of the third portion 30c is preferably equal to or more than 1.2 times the distance d between the two closest cathode regions 32 among the plurality of $n^+$-type cathode regions 32, more preferably equal to or more than 1.5 times, and most preferably equal to or more than 2 times.

The second minimum width w2 of the second portion 30b is preferably equal to or more than 50% and equal to or less than 80% of the first minimum width w1 of the first portion 30a. When the second minimum width w2 is larger than the above lower limit value, hole injection in the second portion 30b is likely to occur, which further suppresses the occurrence of snapback. In addition, when the second minimum width w2 is smaller than the above upper limit value, the area ratio of the cathode region 32 on the second face F2 increases, and the on-current during diode operation increases.

The third minimum width w3 of the third portion 30c is preferably equal to or more than 20% and equal to or less than 60% of the second minimum width w2 of the second portion 30b. When the third minimum width w3 is larger than the above lower limit value, hole injection that has occurred in the first portion 30a is easily propagated in the third portion 30c, which promotes hole injection in the second portion 30b. Therefore, the occurrence of snapback is further suppressed. In addition, when the third minimum width w3 is smaller than the above upper limit value, the area ratio of the cathode region 32 on the second face F2 increases, and the on-current during diode operation increases.

The fourth minimum width w4 of the cathode region 32 is preferably smaller than the third minimum width w3 of the third portion 30c. By satisfying the above conditions, the area ratio of the collector region 30 on the second face F2 increases, and the on-current during transistor operation increases.

In the RC-IGBT 100 according to the first embodiment, in order to suppress the occurrence of snapback in the current-voltage characteristics, the second portion 30b and the third portion 30c are provided in the collector region 30, unlike in the RC-IGBT 900 of the comparative example. Therefore, in the RC-IGBT 100 according to the first embodiment, the area ratio of the cathode region 32 on the second face F2 may be reduced and the on-current during diode operation may be reduced, as compared with the RC-IGBT 900 of the comparative example.

In the RC-IGBT 100 according to the first embodiment, the on-current during diode operation is increased by providing the p-type first guard ring region 42 and the $n^+$-type peripheral cathode region 48. As shown in FIG. 6, the peripheral cathode region 48 is provided immediately below the first guard ring region 42. The first guard ring region 42 is electrically connected to the upper electrode 12.

Therefore, when the RC-IGBT 100 operates as a diode, the on-current flows from the first guard ring region 42 to the peripheral cathode region 48 through the drift region 36. Therefore, the on-current during diode operation increases.

The p-type impurity concentration of the first guard ring region 42 is preferably higher than the p-type impurity concentration of the base region 38. The increased amount of holes in the first guard ring region 42 increases the efficiency of hole injection from the first guard ring region 42 to the drift region 36 when the RC-IGBT 100 operates as a diode. Therefore, the on-current during diode operation further increases.

The p-type impurity concentration of the first guard ring region 42 is preferably equal to or more than twice the p-type impurity concentration of the base region 38, more preferably equal to or more than five times.

The depth of the first guard ring region 42 is preferably larger than the depth of the base region 38. Since the amount of holes in the first guard ring region 42 increases as the depth of the first guard ring region 42 increases, the efficiency of hole injection from the first guard ring region 42 to the drift region 36 increases when the RC-IGBT 100 operates as a diode. Therefore, the on-current during diode operation further increases.

The depth of the first guard ring region 42 is preferably equal to or more than 1.2 times the depth of the base region 38, more preferably equal to or more than 1.5 times, and even more preferably equal to or more than 2 times.

The peripheral cathode region 48 is preferably provided immediately below the second guard ring region 44 and the third guard ring region 46. When the RC-IGBT 100 operates as a diode, a current can flow in an oblique direction from the first guard ring region 42 to the peripheral cathode region 48 immediately below the second guard ring region 44 and the third guard ring region 46. Therefore, the on-current during diode operation further increases.

As described above, according to the first embodiment, it is possible to suppress the degradation of the operating characteristics of the RC-IGBT by suppressing the occurrence of snapback.

Second Embodiment

A semiconductor device according to a second embodiment is different from the semiconductor device according to the first embodiment in that the second semiconductor region has a stripe shape. Hereinafter, the description of a part of the content overlapping the first embodiment will be omitted.

Figure 9:
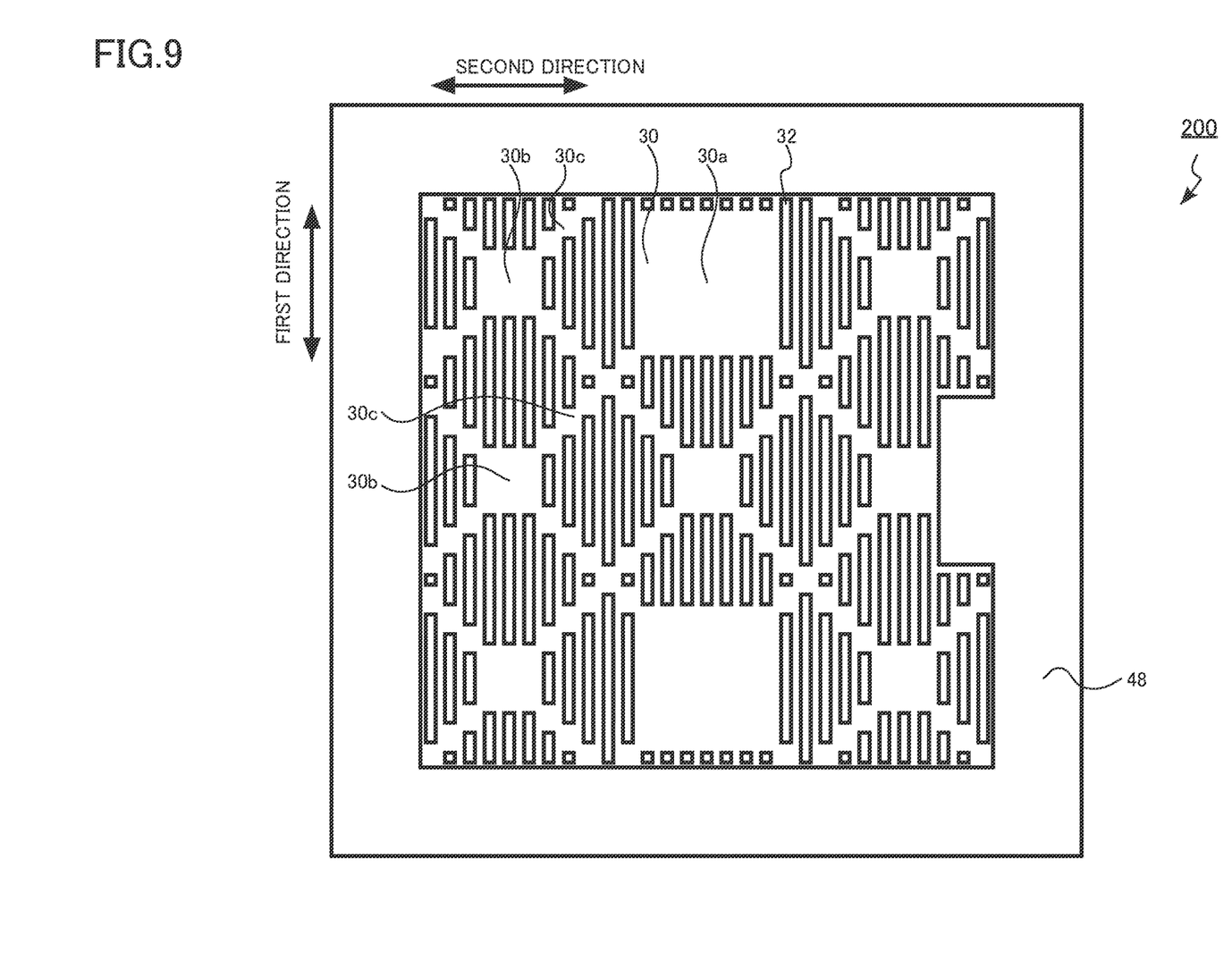
FIG. 9 is a schematic plan view of a semiconductor device according to a second embodiment.

The semiconductor device according to the second embodiment is an RC-IGBT 200 in which an IGBT and a freewheeling diode are formed in the same semiconductor chip.

FIG. 9 is a schematic plan view of the semiconductor device according to the second embodiment. FIG. 9 shows a pattern of semiconductor regions in a semiconductor layer on the second face side of the RC-IGBT 200. FIG. 9 is a diagram corresponding to FIG. 3 of the first embodiment.

An $n^+$-type cathode region 32 of the RC-IGBT 200 according to the second embodiment has a stripe shape as shown in FIG. 9. The cathode region 32 extends, for example, in the first direction.

As described above, according to the second embodiment, as in the first embodiment, it is possible to suppress the degradation of the operating characteristics of the RC-IGBT by suppressing the occurrence of snapback.

Third Embodiment

A semiconductor device according to a third embodiment is different from the semiconductor device according to the first embodiment in that the third portion of the first semiconductor region extends in parallel to the first direction or the second direction. Hereinafter, the description of a part of the content overlapping the first embodiment will be omitted.

Figure 10:
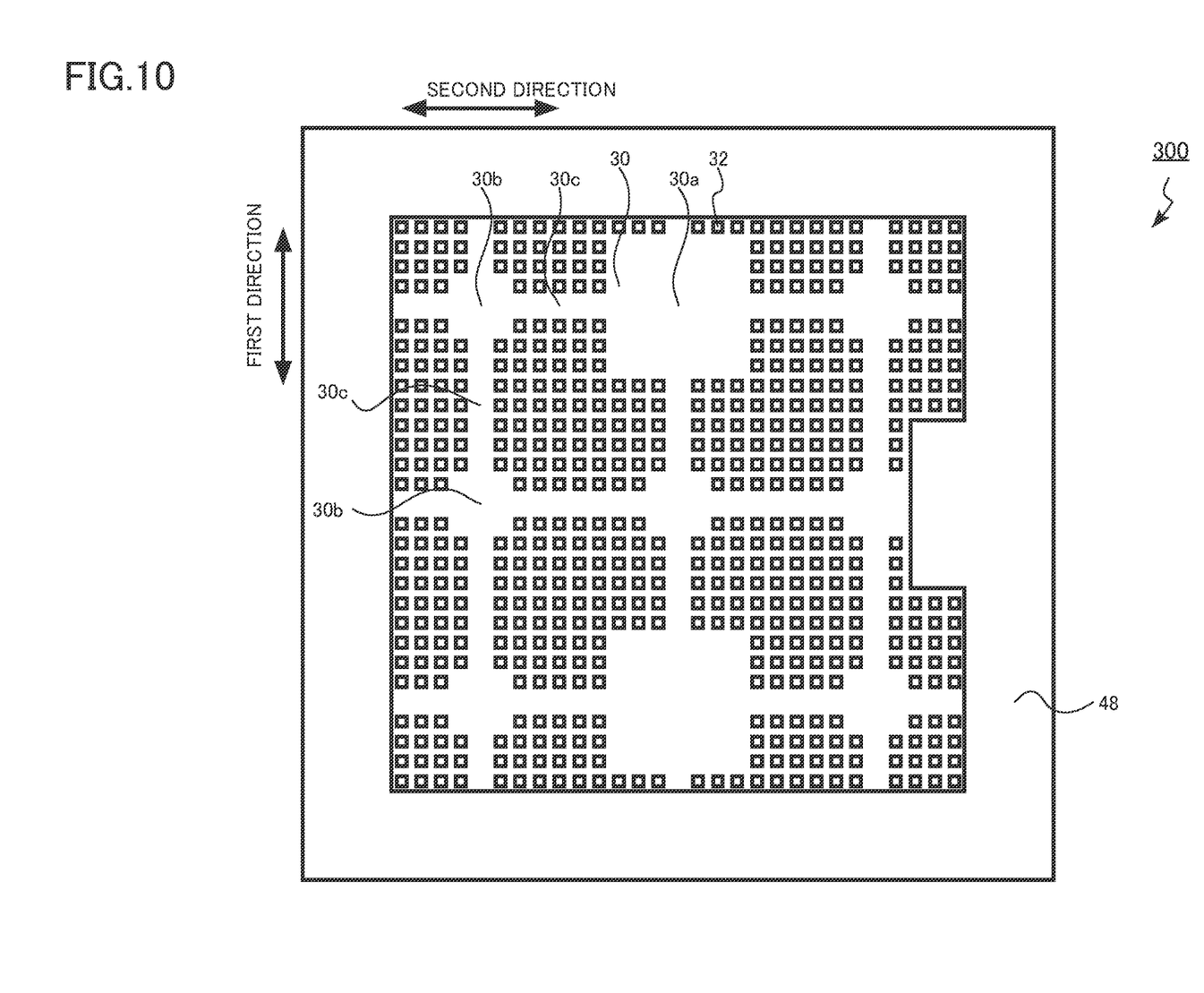
FIG. 10 is a schematic plan view of a semiconductor device according to a third embodiment.

The semiconductor device according to the third embodiment is an RC-IGBT 300 in which an IGBT and a freewheeling diode are formed in the same semiconductor chip.

FIG. 10 is a schematic plan view of the semiconductor device according to the third embodiment. FIG. 10 shows a pattern of semiconductor regions in a semiconductor layer on the second face side of the RC-IGBT 300. FIG. 10 is a diagram corresponding to FIG. 3 of the first embodiment.

A third portion 30c of a collector region 30 of the RC-IGBT 300 according to the third embodiment extends in parallel to the first direction or the second direction.

As described above, according to the third embodiment, as in the first embodiment, it is possible to suppress the degradation of the operating characteristics of the RC-IGBT by suppressing the occurrence of snapback.

In the first to third embodiments, the case where the semiconductor layer is single crystal silicon has been described as an example. However, the semiconductor layer is not limited to the single crystal silicon. For example, other single crystal semiconductors, such as single crystal silicon carbide, may be used.

In the first to third embodiments, the case of a stripe shape in which trenches are arranged in parallel to each other has been described as an example. However, embodiments can also be applied to a mesh-shaped trench in which trenches cross each other or a dot-shaped trench.

In the first to third embodiments, the case of the trench gate type IGBT in which the gate electrode is provided in the trench has been described as an example. However, embodiments can also be applied to a planar gate type IGBT in which the gate electrode is provided on the surface of the semiconductor layer.

In the first to third embodiments, the case where the collector region 30 includes the first portion 30a, the second portion 30b, and the third portion 30c has been described as an example. However, it is also possible to adopt, for example, a structure in which the collector region 30 further includes a fourth portion whose minimum width is an intermediate width between the first minimum width w1 of the first portion 30a and the second minimum width w2 of the second portion 30b.

In the first to third embodiments, the case where the first portion 30a and the second portion 30b of the collector region 30 are squares has been described as an example. However, the shape of each of the first portion 30a and the second portion 30b is not limited to the square, and may be a rectangle or a circle, for example. In addition, the arrangement pattern of the first portion 30a and the second portion 30b is not limited to the arrangement patterns of the first to third embodiments.

In the first to third embodiments, the case where the first conductive type is a p-type and the second conductive type is an n-type has been described as an example. However, the first conductive type can be an n-type and the second conductive type can be a p-type.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer having a first face and a second face facing the first face;
   a first semiconductor region of a first conductive type provided in the semiconductor layer, in contact with the second face, and including a first portion having a first minimum width, a second portion having a second minimum width smaller than the first minimum width, and a third portion connecting the first portion and the second portion to each other and having a third minimum width smaller than the second minimum width;
   a plurality of second semiconductor regions of a second conductive type provided in the semiconductor layer, in contact with the second face, and provided so as to be separated from each other in the first semiconductor region other than the first portion, the second portion, and the third portion;
   a third semiconductor region of the second conductive type provided in the semiconductor layer and provided between the first semiconductor region and the first face and between the second semiconductor region and the first face;
   a fourth semiconductor region of the first conductive type provided in the semiconductor layer and provided between the third semiconductor region and the first face;
   a fifth semiconductor region of the second conductive type provided in the semiconductor layer and provided between the fourth semiconductor region and the first face;
   a gate electrode facing the fourth semiconductor region;
   a gate insulating film provided between the fourth semiconductor region and the gate electrode;
   a first electrode in contact with the first face; and
   a second electrode in contact with the second face.

2. The semiconductor device according to claim 1, wherein the third minimum width is larger than a distance between two closest second semiconductor regions among the plurality of second semiconductor regions of the second conductive type.

3. The semiconductor device according to claim 1, wherein the second minimum width is equal to or more than 50% and equal to or less than 80% of the first minimum width.

4. The semiconductor device according to claim 1, wherein the third minimum width is equal to or more than 20% and equal to or less than 60% of the second minimum width.

5. The semiconductor device according to claim 1, wherein the second semiconductor region has a fourth minimum width, and
   the fourth minimum width is smaller than the third minimum width.

6. The semiconductor device according to claim 1, wherein the first electrode is electrically connected to the fourth semiconductor region and the fifth semiconductor region.

7. The semiconductor device according to claim 1, further comprising:
   a sixth semiconductor region of the first conductive type provided in the semiconductor layer, provided between the first semiconductor region and the first face, and surrounding the fourth semiconductor region on the first face; and a seventh semiconductor region of the second conductive type provided in the semiconductor layer, in contact with the second face, surrounding the first semiconductor region on the second face, and provided in a direction from the first face toward the second face with respect to the sixth semiconductor region.

8. The semiconductor device according to claim 7, wherein the first electrode is electrically connected to the sixth semiconductor region.

9. The semiconductor device according to claim 8, further comprising:

an eighth semiconductor region of the first conductive type provided in the semiconductor layer, surrounding the sixth semiconductor region on the first face, and electrically isolated from the first electrode, the third semiconductor region being provided between the sixth semiconductor region and the eighth semiconductor region, wherein the seventh semiconductor region is provided in a direction from the first face toward the second face with respect to the eighth semiconductor region.

10. The semiconductor device according to claim 7, wherein a first conductive type impurity concentration in the sixth semiconductor region is higher than a first conductive type impurity concentration in the fourth semiconductor region.

11. The semiconductor device according to claim 7, wherein a depth of the sixth semiconductor region with respect to the first face is larger than a depth of the fourth semiconductor region with respect to the first face.

* * * * *